US008518721B2

(12) United States Patent
Chumakov et al.

(10) Patent No.: US 8,518,721 B2
(45) Date of Patent: Aug. 27, 2013

(54) DOPANT MARKER FOR PRECISE RECESS CONTROL

(75) Inventors: Dmytro Chumakov, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/471,684

(22) Filed: May 15, 2012

(65) Prior Publication Data

US 2012/0225503 A1 Sep. 6, 2012

Related U.S. Application Data

(62) Division of application No. 12/947,150, filed on Nov. 16, 2010, now Pat. No. 8,202,739.

(51) Int. Cl.
*H01L 21/00* (2006.01)
*G01R 31/26* (2006.01)

(52) U.S. Cl.
USPC ............ 438/7; 438/8; 438/9; 438/11; 438/16; 438/17; 438/18

(58) Field of Classification Search
USPC ....................... 438/14; 257/E21.53, E21.531
See application file for complete search history.

(56) References Cited

U.S. PATENT DOCUMENTS

| | | | | |
|---|---|---|---|---|
| 5,116,778 | A | 5/1992 | Haskell et al. | |
| 6,054,333 | A | 4/2000 | Bensaoula | |
| 6,320,246 | B1 * | 11/2001 | Gilton | 257/650 |
| 6,344,364 | B1 * | 2/2002 | Gilton | 438/14 |
| 6,379,981 | B2 | 4/2002 | Gilton | |
| 2006/0151430 | A1 | 7/2006 | Yang et al. | |
| 2010/0093115 | A1 * | 4/2010 | Kanarik et al. | 438/14 |

OTHER PUBLICATIONS

Office Action for related U.S. Appl. No. 13/471,756 dated Dec. 11, 2012, pp. 1-25.

* cited by examiner

*Primary Examiner* — Kevin Parendo
(74) *Attorney, Agent, or Firm* — Ditthavong Mori & Steiner, P.C.

(57) ABSTRACT

A method is provided including depositing a layer of material on a substrate, during deposition of the material, at a predetermined depth, laterally implanting a first dopant and a second dopant in the material, the second dopant being different from the first dopant, etching the material, during etching, detecting the positions and intensities of the first and second dopants, and calculating lateral homogeneity of the material in situ from the intensities of the first and second dopants.

20 Claims, 2 Drawing Sheets

205 207 209 209 207 205
201
203

DOPANT MARKER FOR PRECISE RECESS CONTROL

CROSS REFERENCE TO RELATED APPLICATIONS

This application is a divisional of U.S. application Ser. No. 12/947,150, filed Nov. 16, 2010, the entirety of which is incorporated herein by reference.

TECHNICAL FIELD

The present disclosure relates to improved recess control in material removal processes. The present disclosure is particularly applicable to fabrication of semiconductors.

BACKGROUND

In semiconductor fabrication, in material removal processes such as chemical mechanical polishing (CMP), etching, or etchback, the stopping point is conventionally controlled by employing etch stops or by setting particular removal times. However, such methods do not guarantee homogenous and controlled material removal. Often if the removal rate or removal homogeneity is not sufficiently precise, the currently processed wafer is misprocessed and corrective action is performed only for subsequent wafers. This may lead to substantial losses.

A need therefore exists for methodology enabling in-situ removal rate definition and removal homogeneity-over-radius definition as well as in-situ corrective action.

SUMMARY

An aspect of the present disclosure is an improved method of forming a semiconductor by employing recess markers at different depths for in-situ removal rate definition.

Another aspect of the present disclosure is an improved method of forming a semiconductor by employing recess markers at different lateral positions for in-situ removal homogeneity-over-radius definition.

Another aspect of the present disclosure is an improved method of forming a semiconductor by employing recess markers for in-situ correction of a material removal process.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: depositing a layer of material on a substrate; during deposition of the material: after a first predetermined period of time, implanting a first dopant in the material; after a second predetermined period of time, implanting a second dopant in the material, the first and second predetermined periods of time together being less than the total deposition time; etching the material; during etching, detecting the depths of the first and second dopants; calculating the removal rate of the material in situ from the depths of the first and second dopants; and determining from the removal rate a stop position for etching.

Aspects of the present disclosure include implanting dopants that do not change the electrical properties of the material. Further aspects include detecting the depths of the first and second dopants by detecting and analyzing a physical, spectral, or chemical property of the first and second dopants. Another aspect includes the first and second dopants being different. Other aspects include implanting the first dopant by temporarily depositing the first dopant simultaneously with the material after the first predetermined period of time; and implanting the second dopant by temporarily depositing the second dopant simultaneously with the material after the second predetermined period of time. Additional aspects include after a third predetermined period of time, implanting a third dopant in the material, the first, second, and third predetermined periods of time together being less than the total deposition time; during etching, detecting the depth of the third dopant; verifying the calculated removal rate of the material from the depth of the third dopant. Further aspects include the first, second, and third dopants being equally spaced through the layer thickness. Other aspects include the first, second, and third dopants being asymmetrically spaced through the layer thickness.

Another aspect of the present disclosure is a method of fabricating a semiconductor device, the method comprising: depositing a layer of material on a substrate; during deposition of the material, at a predetermined depth, laterally implanting a first dopant and a second dopant in the material; etching the material; during etching, detecting the positions and intensities of the first and second dopants; and calculating lateral homogeneity of the material in situ from the intensities of the first and second dopants.

Aspects include implanting dopants that do not change the electrical properties of the material. Further aspects include detecting the positions and intensities of the first and second dopants by detecting and analyzing a physical, spectral, or chemical property of the first and second dopants. Other aspects include implanting the first and second dopants by beam implantation. Another aspect includes implanting the first and second dopants as concentric rings. Additional aspects include implanting the first and second dopants at a depth of ¼ to ¾ of the thickness of the layer of material. Further aspects include implanting a third dopant in the material as a third concentric ring; during etching, detecting the position and intensity of the third dopant; and verifying the calculated lateral homogeneity of the material from the position and intensity of the third dopant.

Another aspect of the present disclosure is a method of fabricating a semiconductor device, the method comprising: depositing a layer of material on a substrate; implanting at least two dopants in the material during deposition; removing the material; during material removal, detecting the dopants; calculating the removal rate of the material in situ from the depths of the dopants and/or calculating lateral homogeneity of the material in situ from the appearance of the dopants; and correcting the removal process to improve the removal rate and/or the lateral homogeneity of the material.

Aspects include correcting the removal process by controlling the relative intensity or relative timing. Further aspects include removing by CMP, and correcting the removal process by changing pressure settings for the CMP to improve the lateral homogeneity of the material. Other aspects include removing by plasma etching, and correcting the removal process by biasing the edges of the layer. Additional aspects include implanting three dopants in the material during deposition.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of unreliable recess control and non-homogeneous removal attendant upon etching or polishing a layer of material. In accordance with embodiments of the present disclosure, recess markers are implanted during deposition of the layer. The markers leave short traces which are then detected and analyzed during the etching or polishing process. From the detected traces, removal rates, precise definition of the stop point, and lateral homogeneity can be in-situ calculated. Further, any needed corrective action may be determined and performed in-situ.

Methodology in accordance with embodiments of the present disclosure includes depositing a layer of material on a substrate, during deposition of the material, after first and second predetermined periods of time, implanting first and second dopants, respectively, in the material, the first and second predetermined periods of time together being less than the total deposition time, etching the material, during etching, detecting the depths of the first and second dopants, calculating the removal rate of the material in situ from the depths of the first and second dopants, and determining from the removal rate a stop position for etching.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
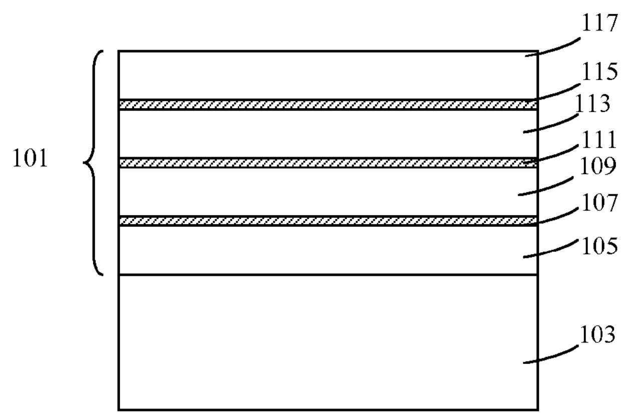
FIG. 1A schematically illustrates deposition of a material with three implanted recess markers, in accordance with an exemplary embodiment.
Figure 1B:
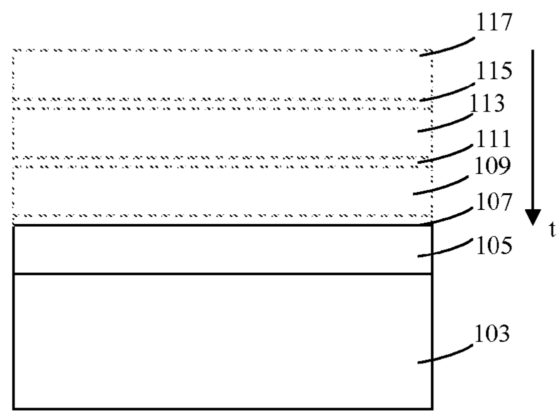
FIG. 1B schematically illustrates removal of the material of FIG. 1A at time t.
Figure 1C:
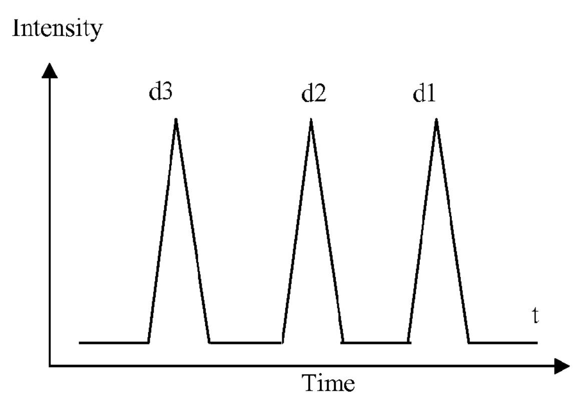
FIG. 1C schematically illustrates detection and recordation of the three recess markers through time t.

FIGS. 1A through 1C schematically illustrate the process flow for etching, in accordance with an exemplary embodiment. Adverting to FIG. 1A, a layer 101 of material to be etched may be deposited on a substrate 103. During the deposition, after a first amount 105 is deposited (or after a predetermined time period), a first recess marker d1 may be implanted across the entire layer (shown as reference element 107). The deposition may continue with a second amount 109 of material (or for a second predetermined time period), followed by implantation of a second recess marker d2 (shown at 111). A third amount 113 of material may be deposited (or deposition may continue for a third predetermined time period), followed by implantation of a third recess marker d3 (shown at 115), and a final deposition 117 of the material. Deposition may stop after each predetermined time period for implantation of a reference marker, or each dopant may be temporarily added to the deposition chamber at a designated time. The recess markers may be equally spaced through the thickness of layer 101 or may be asymmetrically spaced. The particular positioning of the recess markers depends on the material and the process.

Reference markers d1, d2, and d3 may be the same or different. Each dopant employed must not change electrical or other properties of the material being deposited. Further, the dopants must be detectable by physical, spectral, or chemical analysis. For example, if the material being deposited is Tetraethyl orthosilicate (TEOS), such as for forming an interlayer dielectric (ILD), dopants d1, d2, and d3 may be boron (B), nitrogen (N), and/or phosphorus (P). Although three recess markers d1, d2, and d3 are shown in FIG. 1A, only one reference marker may be employed to determine a reference position, or at least two may be employed to determine a deposition rate.

FIG. 1B, illustrates progress of the removal process. Specifically, FIG. 1B illustrates time t, after all of the material except amount 105 has been removed. During material removal, the physical, spectral, chemical, or other detectable information may be detected and recorded. Markers d1, d2, and d3 will leave short traces that can be detected as the etching process reaches them. As illustrated in FIG. 1C, by time t, three intensity peaks have been recorded for the three dopants. Based on the traces, the removal rate can be in-situ calculated, for example by calculating the time or pressure between consecutive traces, and a very precise definition of the stop point for etching can be made. Accordingly, the etch depth can be accurately controlled. In addition, if the process has deviated from the expected flow, in-situ correction can be performed from the calculated removal rate and stop point. As a result losses may be minimized and output may be increased.

FIGS. 2A through 2D schematically illustrate the process flow for etching, in accordance with another exemplary embodiment. Adverting to FIGS. 2A and 2B, a layer 201 of material to be etched or polished, for example by chemical mechanical polishing (CMP) may be deposited on a substrate 203. During the deposition, three recess markers d1, d2, and d3 (shown at 205, 207, and 209) may be implanted, for example by simple beam implantation, to mark the wafer laterally. As illustrated, the three recess markers may be implanted simultaneously, for example as concentric rings part way through the deposition of material. Although the depth of the recess markers depends on the thickness of the layer of material (which may range from 100 nanometers (nm) to 2 microns (μm)), the dopants may be implanted at a depth of ¼ to ¾ of the layer thickness, e.g. at ½ of the layer thickness. Recess markers d1, d2, and d3 should all be different. For example, for forming an interlayer dielectric (ILD) such as a TEOS layer, dopants d1, d2, and d3 may be boron (B), nitrogen (N), and phosphorus (P).

Figure 2A:
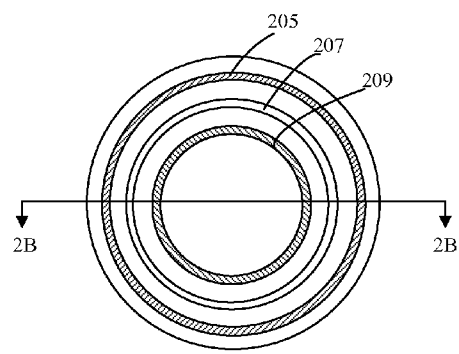
FIG. 2A schematically illustrates a top view of deposition of a material with three implanted recess markers, in accordance with another exemplary embodiment.
Figure 2B:
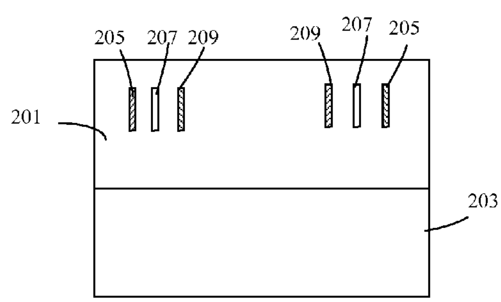
FIG. 2B schematically illustrates a cross-sectional view along line 2B-2B in FIG. 2A.
Figure 2C:
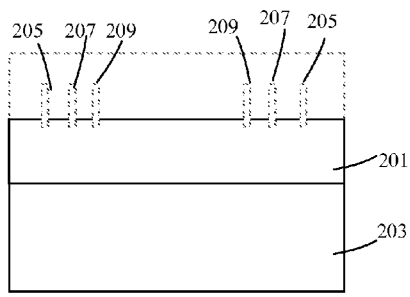
FIG. 2C schematically illustrates removal of the material of FIGS. 2A and 2B at time t.
Figure 2D:
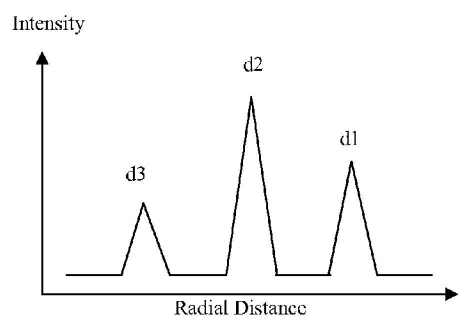
FIG. 2D schematically illustrates detection and recordation of the three recess markers at time t.

FIG. 2C schematically illustrates progress of the removal process. During material removal, the physical, spectral, chemical, or other detectable information may be detected and recorded as illustrated in FIG. 2D. As the removal process reaches the implants, their traces will appear in the detected signal. Their intensity versus their relative positions on the wafer at a given time may be recorded. Based on the intensity and appearance lag time of recess markers d1, d2, and d3, the removal rates and lateral homogeneity may be precisely derived. The removal tools may be programmed for automatic in-situ precision sustaining. Accordingly, if the removal rate differs from the expected process flow, or if the removal is determined to be non-homogenous across the layer, corrective action may be performed in-situ. For example, if the edge of the wafer is polished faster than the center, recess marker d3 would appear prior to recess markers d1 and d2. The relative intensity or relative timing may be controlled, the pressure settings may be adjusted for CMP, or edge biasing may be changed for etching. As a result, losses are reduced and output is increased.

The embodiments of the present disclosure can achieve several technical effects, including homogeneous material removal both laterally and vertically, precise stop point definition, and in-situ correction of removal rates, thereby reducing losses and increasing output. The present disclosure enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:

depositing a layer of material on a substrate;

during deposition of the material, at a predetermined depth, implanting a first dopant and a second dopant in the material at different lateral locations, the second dopant being different from the first dopant;

etching the material;

during the etching, detecting the positions and intensities of the first and second dopants; and calculating lateral homogeneity of the material in situ from the intensities of the first and second dopants.

2. The method according to claim 1, wherein the first and second dopants do not change the electrical properties of the material.

3. The method according to claim 2, wherein the detecting the positions and intensities of the first and second dopants is by detecting and analyzing a physical property of the first and second dopants.

4. The method according to claim 2, wherein the detecting the positions and intensities of the first and second dopants is by detecting and analyzing a spectral property of the first and second dopants.

5. The method according to claim 2, wherein the detecting the positions and intensities of the first and second dopants is by detecting and analyzing a chemical property of the first and second dopants.

6. The method according to claim 1, wherein the implanting the first and second dopants is by beam implantation.

7. The method according to claim 1, wherein the layer of material has a thickness of 100 nm to 2 μm.

8. The method according to claim 7, wherein the first and second dopants are implanted at a depth of ¼ to ¼ of the thickness of the layer of material.

9. The method according to claim 1, wherein the first and second dopants are implanted as concentric rings.

10. The method according to claim 9, further comprising:

implanting a third dopant in the material as a third concentric ring;

during the etching, detecting the position and intensity of the third dopant; and verifying the calculated lateral homogeneity of the material from the position and intensity of the third dopant.

11. A method comprising:

depositing an interlayer dielectric (ILD) on a substrate;

during deposition of the ILD, at a predetermined depth, implanting a first dopant and a second dopant in the ILD at different lateral locations, the second dopant being different from the first dopant;

etching the ILD;

during the etching, detecting the positions and intensities of the first and second dopants; and calculating lateral homogeneity of the ILD in situ from the intensities of the first and second dopants.

12. The method according to claim 11, wherein the ILD comprises tetraethyl orthosilicate (TEOS).

13. The method according to claim 12, wherein the first and second dopants are each boron (B), nitrogen (N), or phosphorus (P).

14. The method according to claim 11, wherein the detecting the positions and intensities of the first and second dopants is by detecting and analyzing a physical, spectral, or chemical property of the first and second dopants.

15. The method according to claim 11, wherein the implanting the first and second dopants is by beam implantation.

16. The method according to claim 11, wherein the ILD has a thickness of 100 nm to 2 μm.

17. The method according to claim 16, wherein the first and second dopants are implanted at a depth of ¼ to ¼ of the thickness of the ILD.

18. The method according to claim 11, wherein the first and second dopants are implanted simultaneously as concentric rings.

19. The method according to claim 18, further comprising:

implanting a third dopant, different from the first and second dopants, in the ILD, simultaneously with the first and second dopants as a third concentric ring;

during the etching, detecting the position and intensity of the third dopant; and verifying the calculated lateral homogeneity of the ILD from the position and intensity of the third dopant.

20. A method comprising:

depositing a tetraethyl orthosilicate (TEOS) interlayer dielectric (ILD) on a substrate;

during deposition of the TEOS ILD, at a predetermined depth, ion implanting first, second, and third dopants of boron (B), nitrogen (N), and/or phosphorus (P), in the TEOS as concentric circles, the first, second, and third dopants all being different from each other;

etching the TEOS ILD;

during the etching, detecting and analyzing a physical, spectral, or chemical property of each of the first, second, and third dopants to determine the intensity and position of the each of the first, second, and third dopants; and calculating removal rates and lateral homogeneity of the TEOS ILD in situ from the intensities and positions of the first, second, and third dopants.

* * * * *